(12) United States Patent
Matsumoto

(10) Patent No.: US 9,442,389 B2
(45) Date of Patent: Sep. 13, 2016

(54) EXPOSURE APPARATUS AND DEVICE MANUFACTURING METHOD

(71) Applicant: CANON KABUSHIKI KAISHA, Tokyo (JP)

(72) Inventor: Hideki Matsumoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/477,283

(22) Filed: Sep. 4, 2014

(65) Prior Publication Data

US 2015/0070667 A1    Mar. 12, 2015

(30) Foreign Application Priority Data

Sep. 9, 2013    (JP) ................. 2013-185914

(51) Int. Cl.
*G03B 27/52* (2006.01)
*G03B 27/58* (2006.01)
*G03F 7/20* (2006.01)

(52) U.S. Cl.
CPC ....... *G03F 7/70341* (2013.01); *G03F 7/70725* (2013.01)

(58) Field of Classification Search
CPC ................................. G03F 7/70341
USPC ............................. 355/30, 53, 72
See application file for complete search history.

(56) References Cited

U.S. PATENT DOCUMENTS

| 5,610,683 A * | 3/1997 | Takahashi | G03F 7/2041 355/53 |
|---|---|---|---|
| 2006/0132733 A1* | 6/2006 | Modderman | 355/53 |
| 2006/0227308 A1* | 10/2006 | Brink et al. | 355/53 |
| 2008/0117398 A1 | 5/2008 | Emoto | |
| 2009/0153822 A1* | 6/2009 | Shibazaki | 355/53 |
| 2009/0225288 A1* | 9/2009 | Shibazaki | 355/30 |

FOREIGN PATENT DOCUMENTS

| JP | 2008124219 A | 5/2008 |
|---|---|---|
| JP | 2008130745 A | 6/2008 |

* cited by examiner

*Primary Examiner* — Hung Henry Nguyen
(74) *Attorney, Agent, or Firm* — Rossi, Kimms & McDowell LLP

(57) ABSTRACT

An immersion-type exposure apparatus includes a measurement area for measuring a substrate, an exposure area, which differs from the measurement area, for exposing the substrate via a projection optical system, plural stages configured to hold the substrate and to be movable between the exposure area and the measurement area, and a controller configured to control the driving of the plural stages, wherein in a case that one stage of the plural stage is positioned in the exposure area, and immersion liquid that is supplied onto the one stage is retained in exposure area and delivered to another stage, the controller is configured to determine a delivery position of the immersion liquid for the other stage based on at least a first processing position of the other stage.

14 Claims, 12 Drawing Sheets

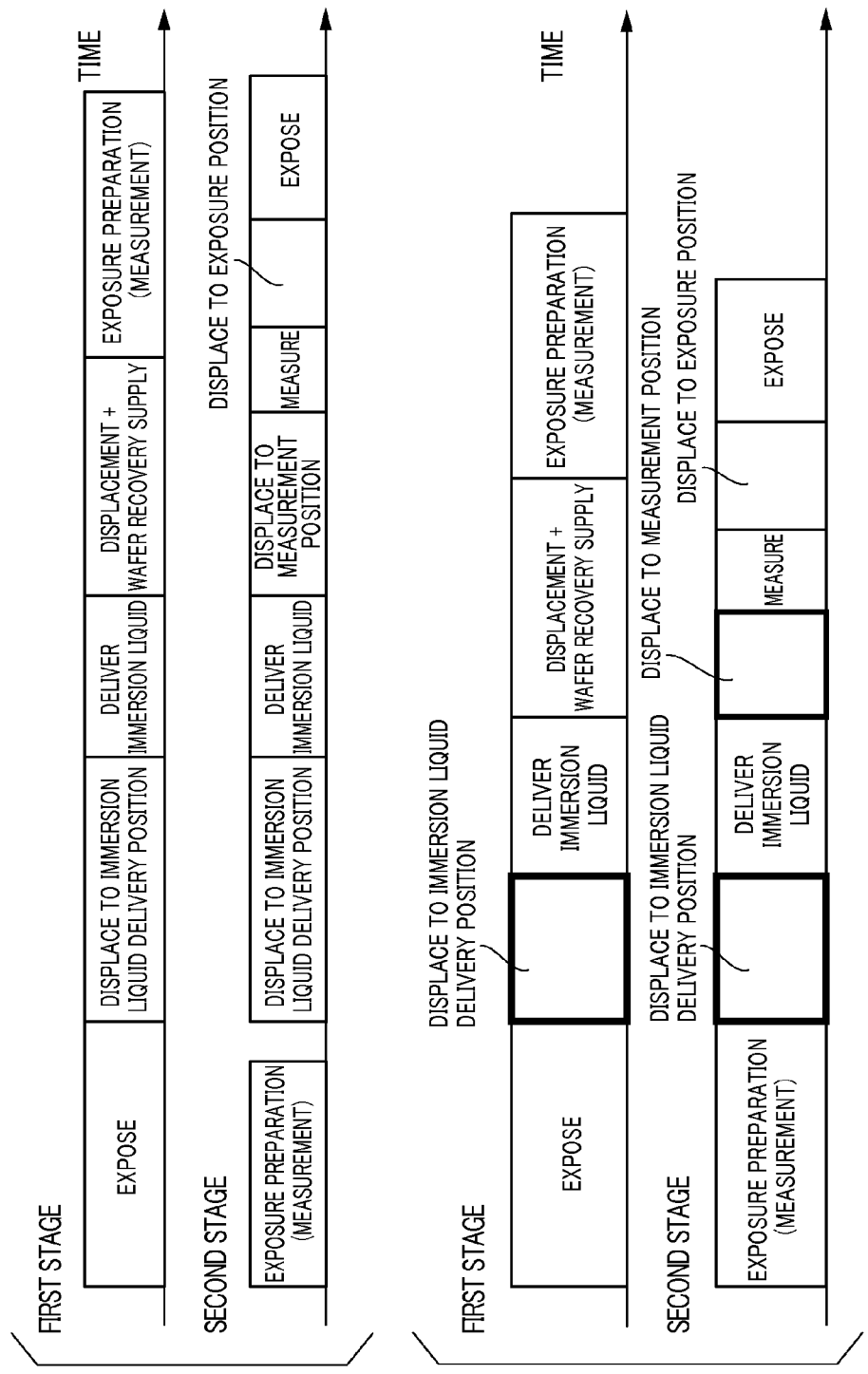

EXPOSURE APPARATUS AND DEVICE MANUFACTURING METHOD

BACKGROUND OF THE INVENTION

1. Field of the Invention

The present invention relates to an exposure apparatus and a device manufacturing method.

2. Description of the Related Art

An exposure apparatus is an apparatus that exposes a pattern of an original (reticle or the like) onto a photosensitive substrate (e.g., wafer where the surface thereof is coated with a resist layer) via a projection optical system in a lithography process of a manufacturing step for a semiconductor device or the like. There is also an immersion exposure apparatus that uses an immersion method as a technique to enhance the resolution of a pattern image that is projected onto a substrate. The immersion exposure apparatus is configured to fill an interval between the final lens of the projection optical system and the substrate with an immersion liquid and to project the pattern image onto the substrate. On the other hand, to improve productivity per unit time, the immersion exposure apparatus may also be provided with plural stages configured to retain a substrate. In the immersion exposure apparatus having only a single substrate stage, an exposure operations is not possible when replacing the substrate or when pre-measuring, and therefore results in a so-called "down time". On the other hand, an immersion exposure apparatus provided with plural substrate stages (for example, two substrate stages) can expose a substrate on one substrate stage while replacing a substrate on the other substrate stage. This configuration allows the immersion exposure apparatus to start exposure of the next substrate on the other substrate stage immediately after completion of exposure of the substrate on the first substrate stage. That is to say, "down time" does not occur when the overall immersion exposure apparatus is considered, and productivity per unit time is enhanced by a configuration in which exposure of one of the substrates is constantly performed.

In this context, an immersion exposure apparatus having plural substrate stages firstly completes exposure of the substrate on one substrate stage, and then rapidly moves another substrate stage below the projection optical system and starts exposure of the next substrate with the result that immersion liquid is delivered between each substrate stage. For example, a method has also been proposed in which supply of immersion liquid is stopped when exposure of one substrate is completed, and supply of the immersion liquid is restarted when another substrate stage moves below the projection optical system. However, this method is not practical due to the fact that time is required to stabilize the state of the supplied immersion liquid after starting supply of the immersion liquid. In this context, a method has been proposed in which immersion liquid that is supplied is delivered without modification from the substrate stage that retains the exposed substrate to the substrate stage that retains the substrate that is the subject of the next exposure operation. Japanese Patent Application Laid-Open No. 2008-124219 discloses an immersion exposure apparatus that predetermines a delivery position of immersion liquid on each substrate stage. This immersion exposure apparatus includes a mirror that is provided on a side of each substrate stage and is used to measure the position of each substrate stage in real time during an exposure operation. The delivery position of immersion liquid in this case is taken to be the end of the substrate stage to thereby avoid hindrance to measurement using the mirror. On the other hand, Japanese Patent Application Laid-Open No. 2008-130745 discloses an immersion exposure apparatus that includes a plurality of delivery positions for immersion liquid on the substrate stage in order to reduce the delivery time.

However, the immersion exposure apparatus disclosed in Japanese Patent Application Laid-Open No. 2008-124219 requires that the path through the predetermined delivery position is always followed during delivery of immersion liquid, and therefore may result in wasted time during deliver depending on the position of the substrate stage when delivery is commenced. Furthermore, the immersion exposure apparatus disclosed in Japanese Patent Application Laid-Open No. 2008-130745 requires an increase in the operational area of the substrate stage in order to deliver immersion liquid. As a result, the size or cost of the apparatus may increase.

SUMMARY OF THE INVENTION

The present invention provides, for example, an immersion-type exposure apparatus which is advantageous in terms of efficient delivery of immersion liquid on its surface between a plurality of substrate stages.

The present invention discloses an exposure apparatus including a measurement area for measuring a substrate, and an exposure area, which differs from the measurement area, for exposing the substrate via a projection optical system, and executing an exposure operation while supplying an immersion liquid between a final lens of the projection optical system and the substrate disposed in the exposure area, the exposure apparatus comprising plural stages configured to hold the substrate and to be movable between the exposure area and the measurement area, and a controller configured to control the driving of the plural stages, wherein in a case that one stage of the plural stage is positioned in the exposure area, and immersion liquid that is supplied onto the one stage is retained in exposure area and delivered to another stage, the controller is configured to determine a delivery position of the immersion liquid for the other stage based on at least a first processing position of the other stage.

Further features of the present invention will become apparent from the following description of exemplary embodiments with reference to the attached drawings.

BRIEF DESCRIPTION OF THE DRAWINGS

FIG. 5A and FIG. 5B is a timing chart illustrating a wafer stage according to the first embodiment.

DESCRIPTION OF THE EMBODIMENTS

The embodiments for executing the present invention will be described below making reference to the drawings.
(First Embodiment)

Figure 1:
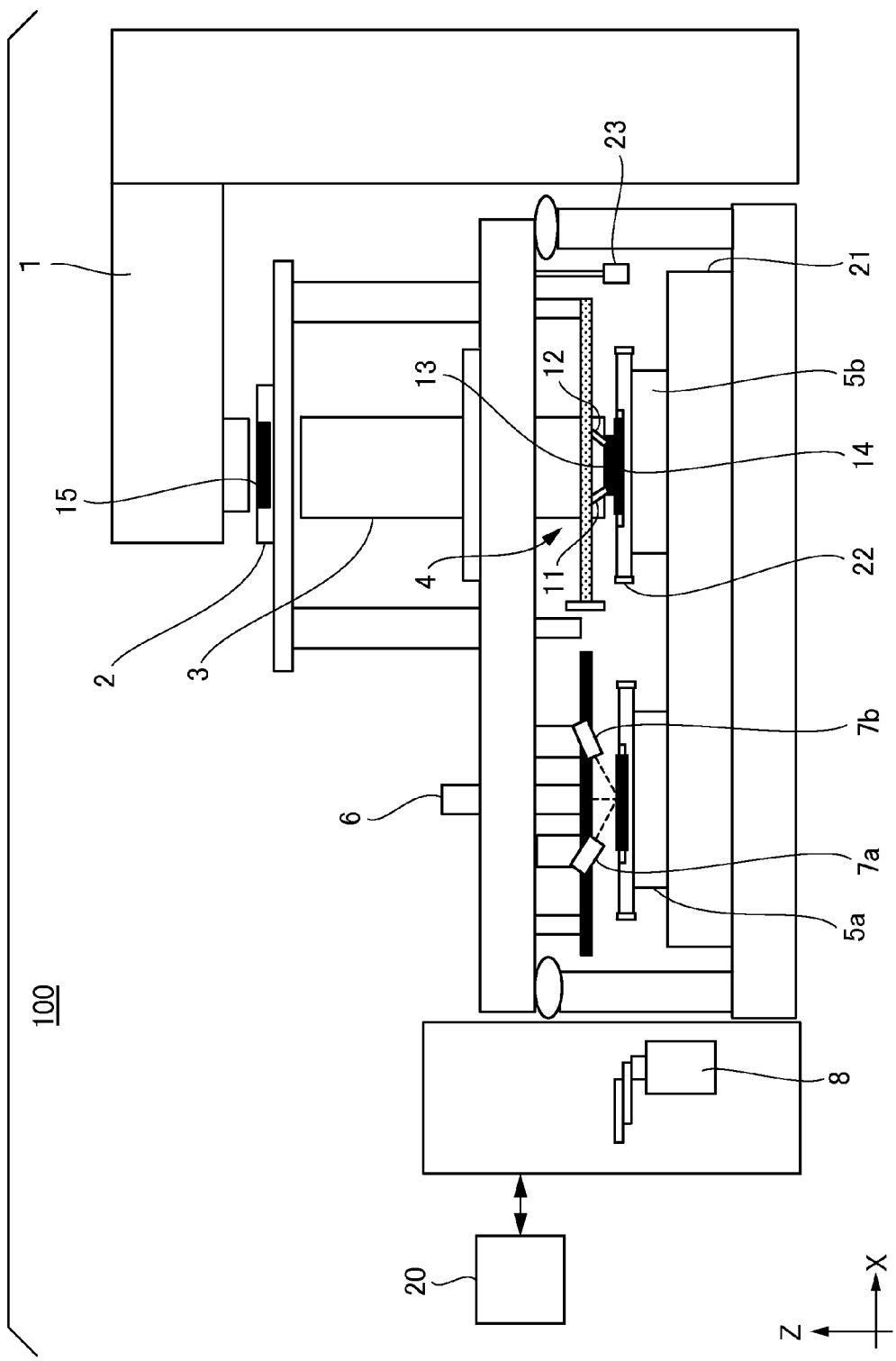
FIG. 1 illustrates a configuration of an exposure apparatus according to a first embodiment of the present invention.

Firstly, the exposure apparatus according to a first embodiment of the present invention will be described. FIG. 1 illustrates a schematic configuration of an exposure apparatus 100 according to the present embodiment. The exposure apparatus 100 is exemplified by a projection exposure apparatus that exposes (transfers) a pattern formed on a reticle 15 by a step-and-repeat system onto a wafer 14 (substrate) and that is used in a manufacturing process of a semiconductor device. Furthermore, the exposure apparatus 100 is configured as an immersion exposure apparatus that uses an immersion method as a technique to enhance the resolution of a pattern image projected onto the wafer 14. In FIG. 1, a description will be given where the Z axis is aligned parallel to the optical axis of a projection optical system 3 (the vertical direction in the present embodiment), the X axis aligned in the scanning direction of the wafer 14 during exposure in the plane perpendicular to the Z axis, and the Y axis is aligned in the non-scanning direction orthogonal to the X axis. The exposure apparatus 100 includes an illumination system 1, a reticle stage 2, a projection optical system 3, a wafer stage 5, an immersion liquid supply mechanism 4, an alignment detection system 6, a focus detection system 7, and a controller 20. Of these components, the illumination system 1, a reticle stage 2, the projection optical system 3 and the immersion liquid supply mechanism 4 are installed in the exposure area in the exposure apparatus 100. On the other hand, the alignment detection system 6 and the focus detection system 7 are installed in the measurement area in the exposure apparatus 100. In this manner, in the exposure apparatus 100, the exposure area has an independent configuration from the measurement area, and as described below, plural stages configured as the wafer stage 5 are movable alternatively through the exposure area and the measurement area.

The illumination system 1 adjusts the light illuminated from a light source (not illustrated), and illuminates the reticle 15. The reticle 15 is an original manufactured from quartz glass for example, that forms a pattern (for example, a circuit pattern) to be transferred onto the wafer 14. The reticle stage 2 holds the reticle 15 and is movable in each of the X and Y axial directions. The projection optical system 3 projects the pattern image on the reticle 15, that is illuminated with light from the illumination system 1, with a predetermined magnification (for example, ½ to ⅕) onto the wafer 14. The wafer 14 is a substrate for example of single crystal silicon having a surface coating of a resist (photosensitizer).

The wafer stage 5 is a so-called twin-stage type stage device that has two sets of a coarse-motion stage and a fine-motion stage that can interchange their mutual positions and are movable mutually on a stage support member 21. Each of these two sets is respectively denoted as "a first stage 5a" and the other is "a second stage 5b". Both the first stage 5a and the second stage 5b hold the wafer 14 and are movable (can change orientation) in each of the XYZ axial directions. In this configuration, the exposure apparatus 100, for example, can perform substitution of the second wafer 14b or alignment measurement (pre-measurement) or the like on the second stage 5b that is positioned in the measurement area during exposure of the first wafer 14a on the first stage 5a that is positioned in the exposure area. That is to say, the exposure apparatus 100 finds utility in enhancing the productivity per unit time since production of a down time in which exposure to any wafer 14 is not executed is avoided, and a configuration is enabled in which exposure is constantly performed in relation to one of the wafers 14. Each stage 5a, 5b is provided with a mirror 22 on respective sides, and the position in the XY plane of each stage 5a, 5b (stage position) can be determined by measuring the distance between the mirrors 22 by use of a laser interferometer 23. In the present embodiment, although the wafer stage 5 will be described with reference to an example of a twin-stage configuration, a configuration having three or more sets of stages is also possible.

The immersion liquid supply mechanism 4 is configured to supply, and thereafter recover, immersion liquid 13, to fill with the immersion liquid 13 the fixed space region between the final lens of the projection optical system 3 and the wafer 14 on the wafer stage 5 (in FIG. 1, the second stage 5b). The immersion liquid supply mechanism 4 includes a supply nozzle 11 that supplies the immersion liquid 13 and the recovery nozzle 12 that recovers the immersion liquid 13 that has been supplied. The exposure apparatus 100 finds utility in transfer of a pattern with enhanced detail by filling the region with an immersion liquid 13 that has a higher refractive index than air, and projecting the pattern image onto the wafer 14.

The alignment detection system 6 includes a projection system configured to project the detection light onto a reference mark on the wafer 14 or the wafer stage 5, and a light receiving system configured to receive the reflected light from the reference mark. The alignment detection system 6 detects the alignment position of the wafer 14 and the alignment position between the wafer 14 and the reticle 15. The alignment detection system 6 may be configured as an off-axis alignment detection system that enables optical detection of the reference mark without using the projection optical system 3. The focus detection system 7 is a focal plane detection device, and includes a projection system 7a that is configured to project detection light towards the surface of the wafer 14, and a light receiving system 7b configured to receive the reflected light, and is configured to detect the position (surface position) in the Z axis direction of the wafer 14. The projection system 7a and the light receiving system 7b are disposed obliquely upward of the reference marks for the alignment detection system 6 respectively.

The controller 20 controls the operation, the adjustment and the like of the respective components of the exposure apparatus 100. In particular, in the present embodiment, the controller 20 controls the movement operation of the wafer stage 5 (first stage 5a and second stage 5b) when delivering the immersion liquid 13 as described in detail below. The controller 20 is configured for example by a computer or the like, and is connected through a line to the respective components of the exposure apparatus 100 to thereby execute control of each component in accordance with a program or the like. In addition, the controller 20 may be configured integrally (in a common housing) with the other units of the exposure apparatus 100, or may be configured as a separate unit (in a separate housing) to the other units of the exposure apparatus 100.

Figure 2:
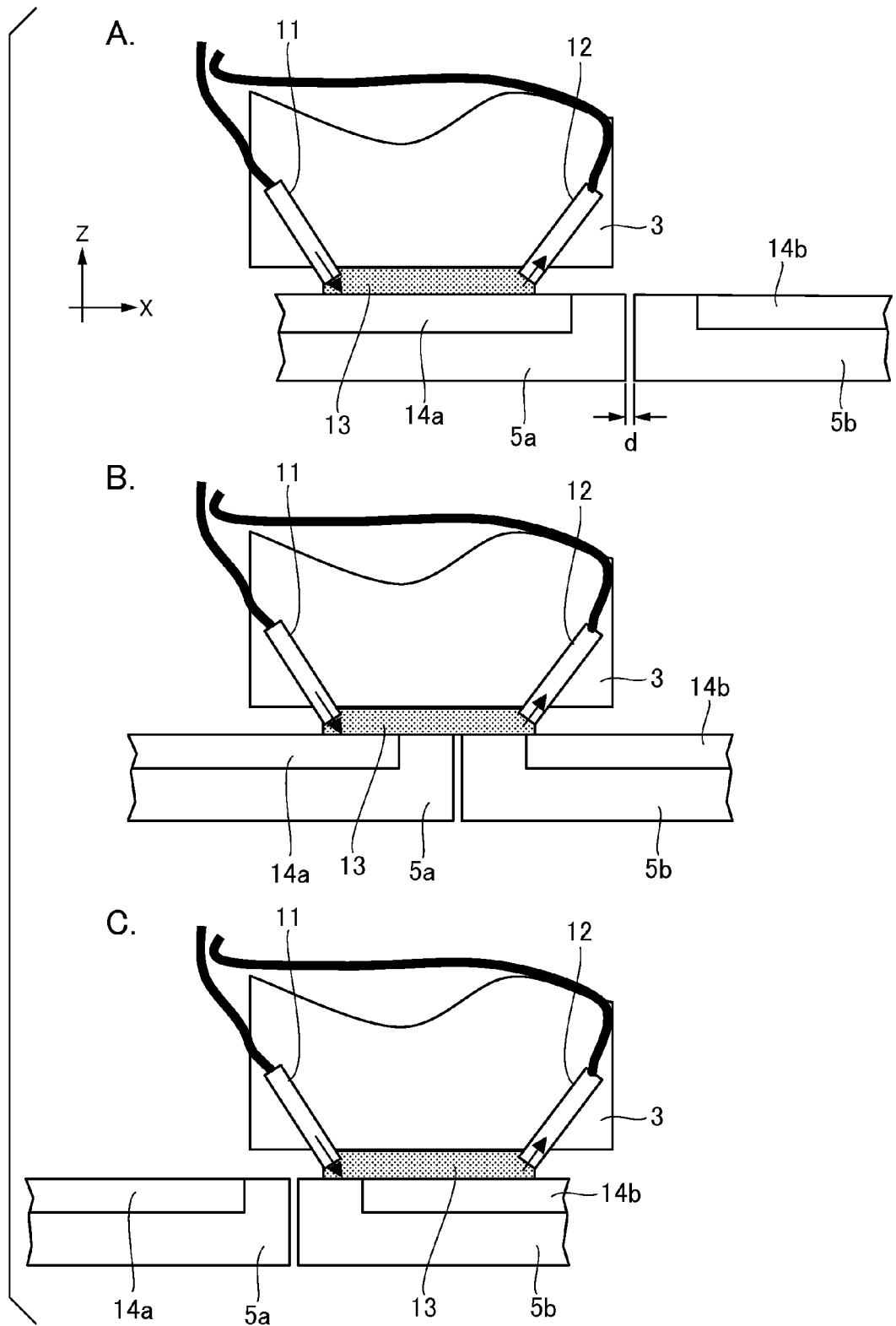
FIG. 2A to FIG. 2C illustrate a configuration when immersion liquid is delivered between respective stages.

Next, the delivery operation of immersion liquid 13 between the first stage 5a and the second stage 5b in the present embodiment will be described. As used herein, "delivery operation" denotes the delivery operation of immersion liquid 13 between each stage 5a, 5b in order to start exposure of a next wafer 14 after exposure of a wafer 14 on one stage has been completed and then another stage is moved below the projection optical system 3. Firstly, the basic delivery operation will be described by referring FIG. 2A to FIG. 2C. FIG. 2A to FIG. 2C are schematic sectional views illustrating a time sequence when the immersion liquid 13 is delivered from the upper surface of the first stage 5a to the upper surface of the second stage 5b as an example. FIG. 2A illustrates a configuration in which the exposure of the first wafer 14a on the first stage 5a that is positioned in a lower portion (exposure position) of the projection optical system 3 is completed, and the second stage 5b that retains the second wafer 14b that is the subject of the subsequent exposure operation has been displaced into proximity. The interval d when the each stage 5a, 5b have been displaced into a configuration of maximum proximity is preferably as small as possible without mutual contact. Next, FIG. 2B illustrates a configuration during delivery of the immersion liquid 13. Entry of the immersion liquid 13 into the area of the interval d is inhibited by a configuration in which the interval d of each stage 5a, 5b is as small as possible and in which water repellency of portions that makes contact with the immersion liquid 13 on each stage 5a, 5b is maintained to a high level. FIG. 2C illustrates a configuration in which the delivery of the immersion liquid 13 has been completed. In this configuration, the first stage 5a commences a recovery operation for the first wafer 14a that has completed the exposure operation whereas the second stage 5b starts an exposure operation in relation to the second wafer 14b.

Figure 3:
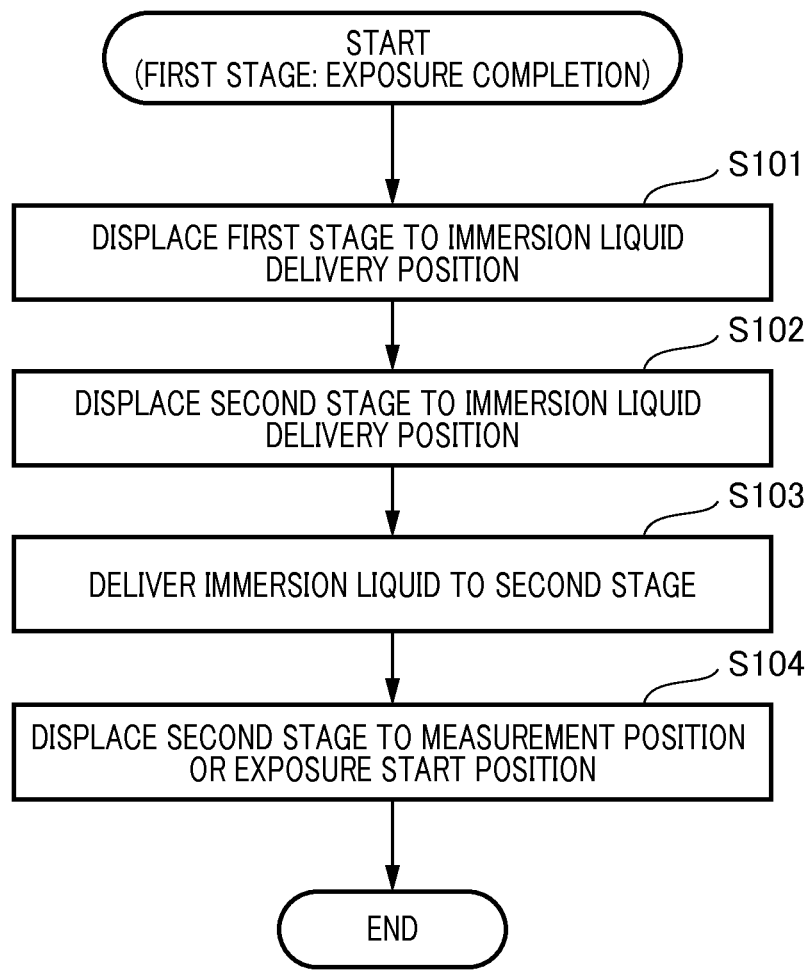
FIG. 3 is a flowchart illustrating the flow of the delivery operation according to the first embodiment.

Next, during the delivery operation of the immersion liquid 13 in the present embodiment, the operation of the respective stages 5a, 5b in the XY plane will be described. Firstly, a conventional delivery operation will be described as a comparative example in order to clarify the characteristic feature of the delivery operation according to the present embodiment. FIG. 3 is a flowchart illustrating the basic sequence of the delivery operation corresponding to both the present embodiment and a conventional configuration. FIG. 12A to FIG. 12D are schematic plan views illustrating a time sequence during a conventional delivery operation. In particular, the drawings is provided as an exemplary configuration from completing exposure of the first wafer 14a on the first stage 5a, to positioning the measurement position on the second stage 5b, or a first pattern forming area, at the exposure position. The respective components illustrated in FIG. 12A to FIG. 12D are denoted for simplicity of comparison using the same reference numerals as that of the corresponding components of the present embodiment. Furthermore, the arrow illustrated in the drawings denotes the track of movement of each of the stages 5a, 5b.

Figure 12:
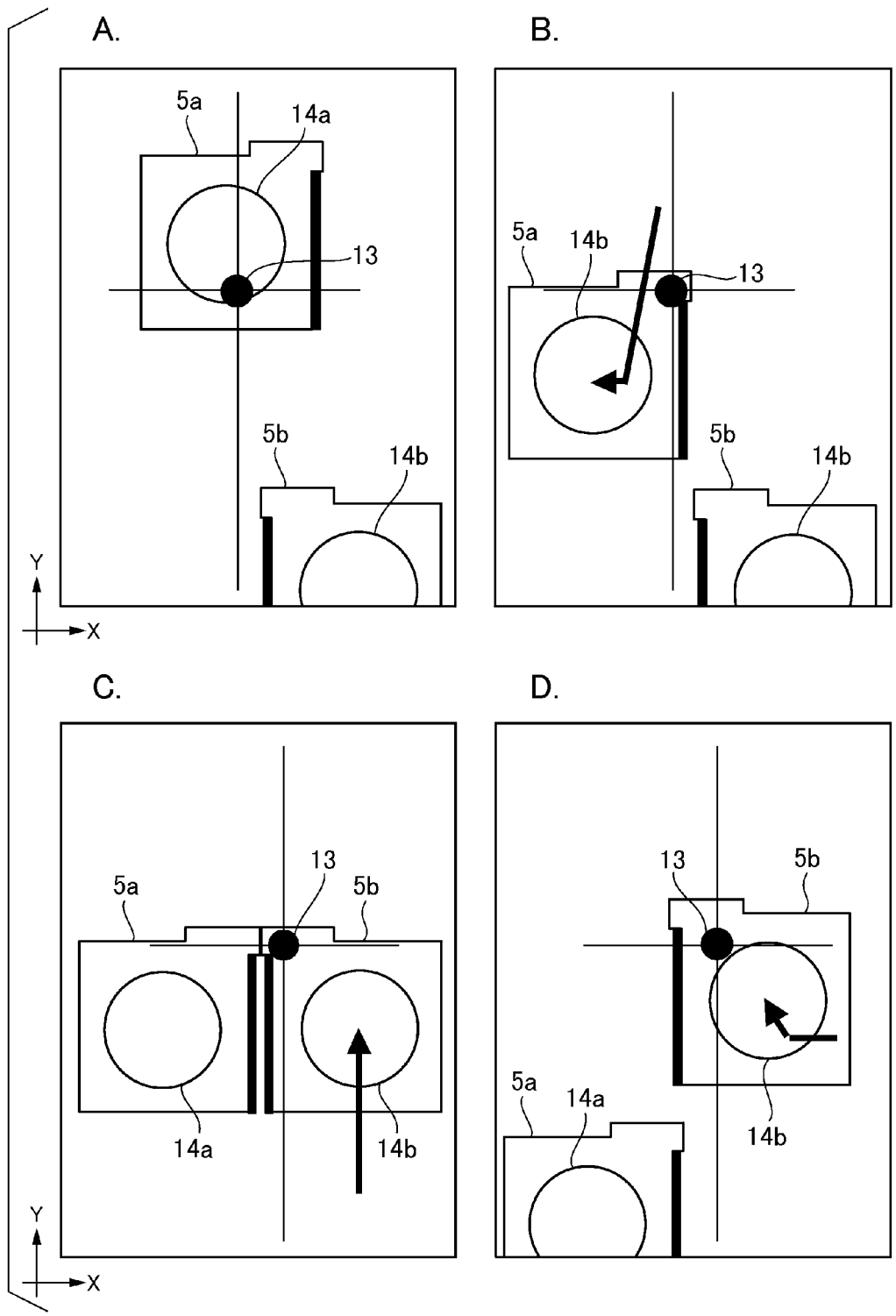
FIG. 12A to FIG. 12D illustrate a time sequence of a conventional delivery operation.

Firstly, the controller 20 displaces the first stage 5a to the delivery position of the immersion liquid 13 after completion of exposure to the first wafer 14a on the first stage 5a (step S101). FIG. 12A illustrates the configuration of each of the stages 5a, 5b when exposure is completed on the first stage 5a. On the other hand, FIG. 12B illustrates a configuration in which the first stage 5a is displaced from the configuration illustrated in FIG. 12A to the delivery position. The conventional wafer stage 5 for example defines the delivery position as a position avoiding the position measurement mirror on the side of the stage, and therefore the first stage 5 is displaced to the delivery position irrespective of the position of the final pattern forming area on the first wafer 14a. Next, the controller 20 displaces the second stage 5b so that the delivery position (in this case, coinciding with the receiving position) of the second stage 5b coincides with the delivery position of the first stage 5a (step S102). Next, the controller 20 matches the delivery positions of each stage 5a, 5b, and then displaces the stages 5a, 5b in parallel to thereby displace the immersion liquid 13 to the delivery position of the second stage 5b (step S103). FIG. 12C illustrates a configuration in which after the second stage 5b is displaced from the configuration illustrated in FIG. 12B to the delivery position, the immersion liquid 13 is displaced onto the second stage 5b. Then the controller 20 causes the first stage 5a to retract (movement to the next specified position), and then causes the second stage 5b to be movable so that the first pattern forming area on the second stage 14b coincides with the exposure position (step S104). FIG. 12D illustrates a configuration in which the second stage 5b is displaced and positioned at the measurement position. In this manner, the operation of the wafer stage 5 during delivery in a conventional configuration requires time in particular for the movement in steps S102 and S104 as a result of the exposure sequence to a pattern forming area that is set on the wafer 14 due to the feature that the delivery position is predetermined.

Figure 4:
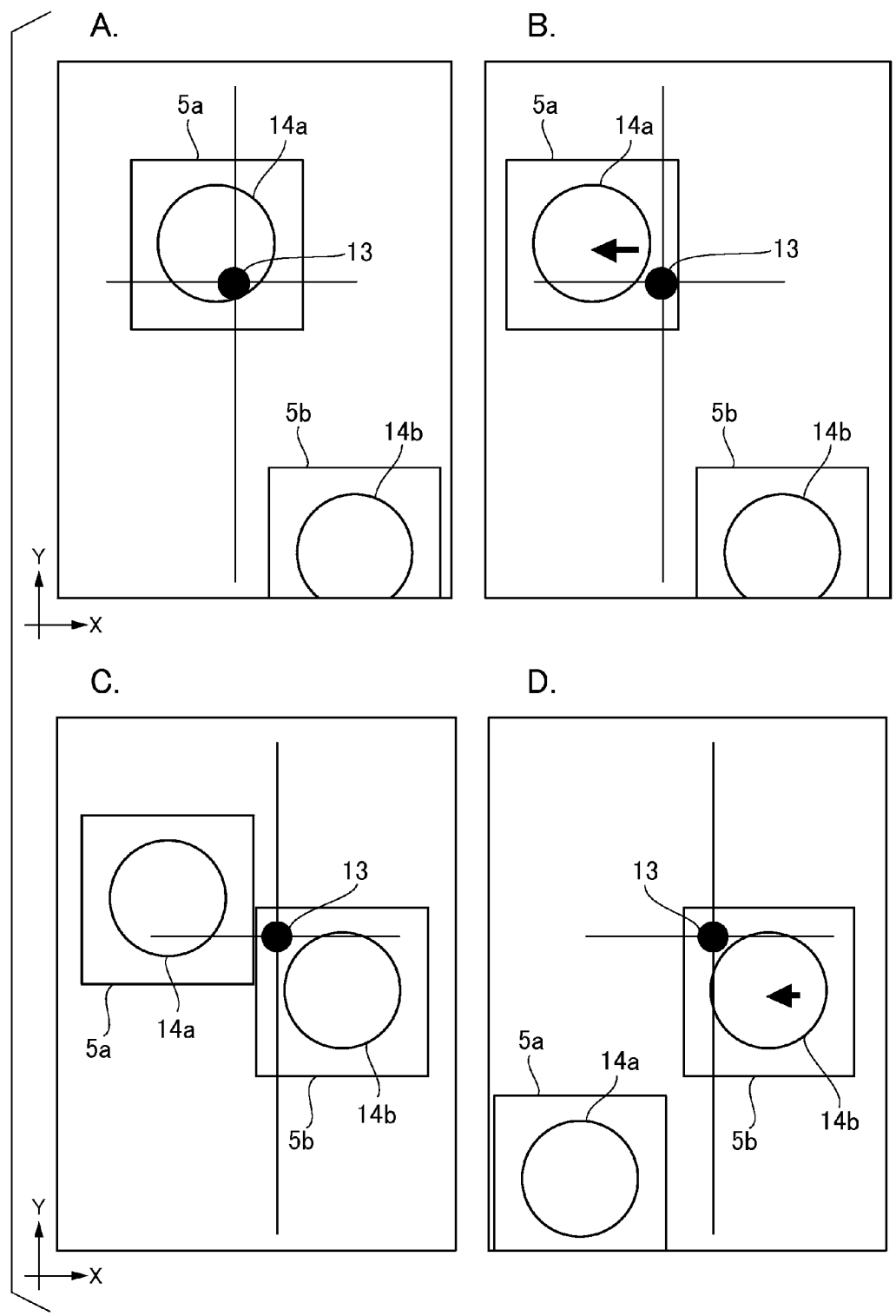
FIG. 4A to FIG. 4D illustrate a time sequence of the delivery operation according to the first embodiment.

On the other hand, the controller 20 in the present embodiment displaces each stage 5a, 5b as described below in accordance with the sequence illustrated in FIG. 3. FIG. 4A to FIG. 4D are schematic plan views illustrating a time sequence of the delivery operation in the present embodiment. Each drawing in FIG. 4A to FIG. 4D corresponds to the each configuration illustrated in FIG. 12A to FIG. 12D that illustrates the conventional delivery operation. The point of difference in the present embodiment from the conventional delivery operation resides in the feature that the delivery position for the immersion liquid for each stage 5a, 5b is not predetermined. For example, in the operation in step S101 of the present embodiment illustrated in FIG. 3, the controller 20 determines the delivery position of the immersion liquid 13 for the first stage 5a based on the exposure completion position, that is to say, the position at which the exposure is completed in the final pattern forming area on the first wafer 14a. The exposure completion position in this configuration is the position denoted as the immersion liquid 13 illustrated in FIG. 4A. The controller 20 is enabled to recognize the exposure completion position prior to an exposure operation based on a formulaic recipe or the like that includes data such as the layout that includes the pattern forming area set on the first wafer 14a, and the sequence of exposure operations in relation to a layout. Next, the controller 20 displaces the first stage 5a linearly in a predetermined direction without modification from the exposure completion position illustrated in FIG. 4A to the position at which the immersion liquid 13 is positioned at the stage end illustrated in FIG. 4B. The position at which the immersion liquid 13 is positioned as illustrated in FIG. 4B is the delivery position for the immersion liquid 13 in the present embodiment. The phrase "displace linearly" means a displacement in a direction enable to drive only using a driving unit for one direction (in this context, the X axis direction) under the control and configuration of a driving device configured to drive each stage 5a, 5b. On the other hand, the conventional displacement to the delivery position illustrated in FIG. 12B is "inclined displacement", that is to say, it drives using at least two driving unit for the X axis direction and the Y axis direction to thereby enable inclined displacement when seen on the XY plane as illustrated in FIG. 12D. The delivery position of the immersion liquid 13 is determined from the whole area of the side of the first stage 5a.

In addition, in the operation of the present embodiment in and following the step S102 in FIG. 3, the controller 20 for example determines the delivery position (receiving position) for the immersion liquid 13 on the second stage 5b in the following manner. That is to say, the delivery position is determined so that the measurement position or the exposure start position (the position for starting the exposure in the first pattern forming area on the second wafer 14b) matches a single direction (in this case, the X axis direction) of the delivery position for the first stage 5a. In this case, the measurement position or the exposure start position (referred to below collectively as the "processing position") is the position denoted as immersion liquid 13 as illustrated in FIG. 4C. The controller 20 displaces the second stage 5b linearly in a predetermined direction without modification from the delivery position illustrated in FIG. 4C to the position that the immersion liquid 13 is positioned at the pattern forming area to be exposure firstly as illustrated in FIG. 4D.

In the above manner, the exposure apparatus 100 enables a reduction in the displacement time of each stage 5a, 5b by determining the delivery position of each stage 5a, 5b based on the first processing position, or the exposure completion position at the delivery of the immersion liquid 13, when compared to a conventional configuration. Furthermore, since the displacement of each stage 5a, 5b at this time is linear, utility is found in power efficiency or a characteristic displacement accuracy of the driving apparatus. In this context, although the displacement of each stage 5a, 5b has been described with reference to the X axis, the same comments may apply when making reference to the Y axis.

FIG. 5 illustrates a timing chart (with the horizontal axis being time) for clarifying the effect of shortening the displacement time of each stage 5a, 5b in the present embodiment in compared to a configuration using a conventional exposure apparatus. FIG. 5A illustrates a timing chart in accordance with the exposure sequence for a conventional exposure apparatus, and FIG. 5B illustrates a timing chart in accordance with the exposure sequence for the exposure apparatus 100 of the present embodiment. In both FIG. 5A and FIG. 5B, the upper row is for the first stage 5a and the lower row is for the second stage 5b. Firstly, the operation of the first stage 5a is illustrated as the flow of "exposure", "displace to delivery position of immersion liquid", "deliver immersion liquid", "displace+recover/supply wafer", and "exposure preparation (measure)". Corresponding to this sequence, the operation of the second stage 5b is illustrated as the flow of "exposure preparation (measure)", "displace to delivery position of immersion liquid", "deliver immersion liquid", "displace to measurement position", "measure", "displace to exposure position", and "exposure". When FIG. 5A and FIG. 5B are compared, the time required for "displace to delivery position of immersion liquid" for the stages 5a, 5b and the time required for "displace to measurement position" for the second stage 5b are shortened due to the above delivery operation. Therefore, when the overall exposure sequence is considered, the processing time can be understood to be reduced to less than the conventional exposure apparatus. The shortening of the processing time has the result of enhancing the productivity of the exposure apparatus.

Next, the position measurement of each stage 5a, 5b that is premised on implementation of the exposure apparatus 100 according to the present embodiment will be described. As described above, the position of each stage 5a, 5b in the XY plane is measured using a laser interferometer 23, and for that purpose, a mirror 22 is provided on each side of each stage 5a, 5b. Although the immersion exposure apparatus according to the conventional technique disclosed in Japanese Patent Application Laid-Open No. 2008-124219 includes installation of an equivalent mirror, the unique delivery position is set to thereby avoid the installation position of the mirror. In this regard, the method of delivery described in the present embodiment enables to is executed even when the mirror 22 is installed, that is to say, depending on the delivery position, delivery of (causing displacement in relation to) the immersion liquid 13 is possible even when straddling the side of the mirror 22. This feature is due to the fact that that it has been determined that actual apparatus operation is enabled due to enhancement to the configuration of the current wafer stage 5 or the technical level related to control. However, in the same manner as the conventional configuration, it may not be preferred for the immersion liquid 13 to move on the sides of the mirror 22. In this context, delivery of the immersion liquid 13 is enabled in relation to the present embodiment by performing the position measurement of each stage 5a, 5b in the following manner.

Figure 6A:
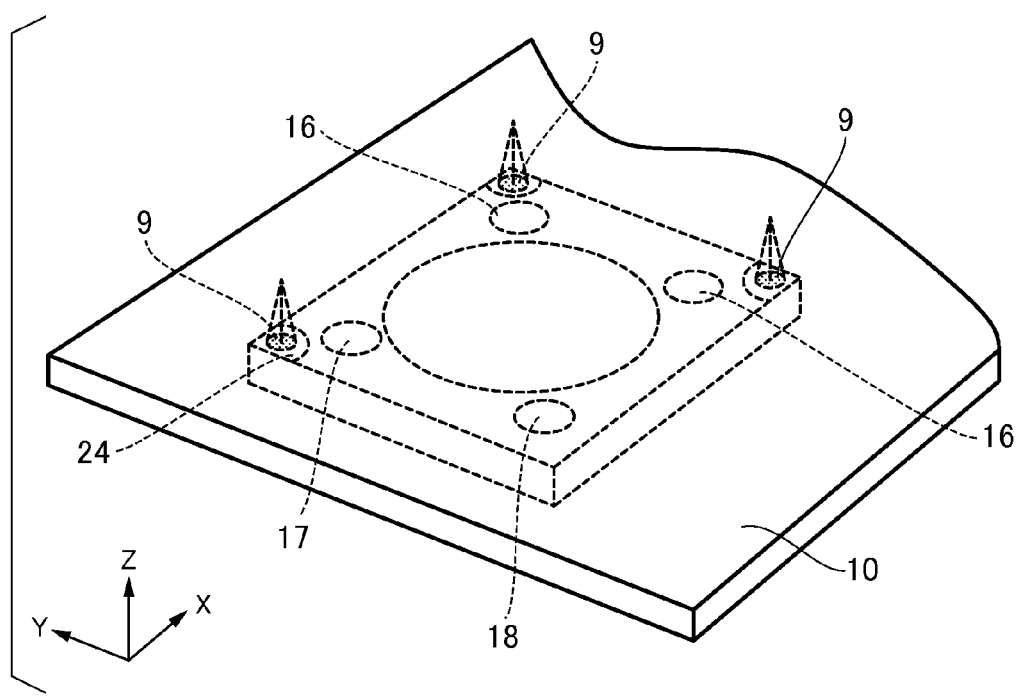
FIG. 6A is a perspective view illustrating a position measurement sensor, or the like provided in substitution for a laser interferometer.
Figure 6B:
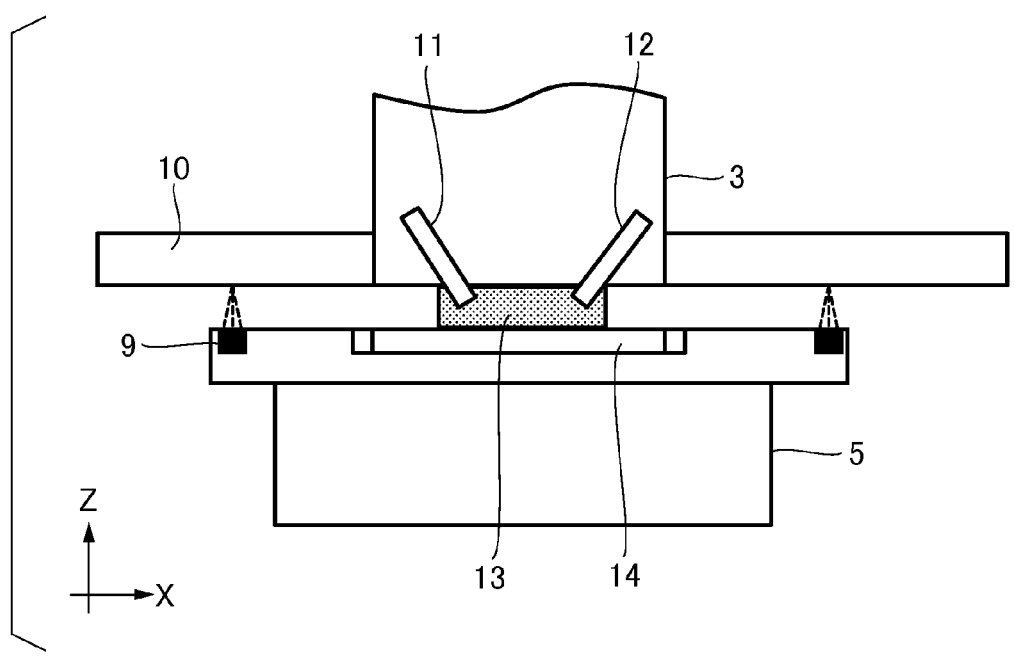
FIG. 6B is a sectional view illustrating a position measurement sensor, or the like provided in substitution for a laser interferometer.
Figure 7:
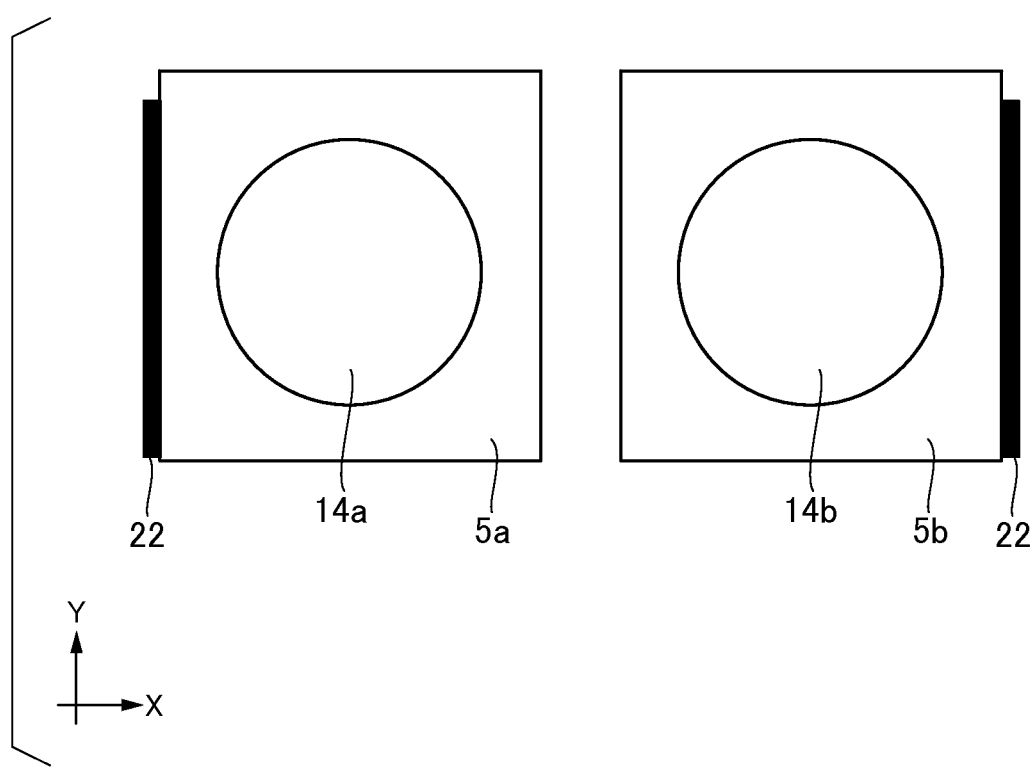
FIG. 7 illustrates a configuration in which a mirror is only provided on the side on which immersion liquid is not delivered.

FIG. 6A and FIG. 6B are schematic views of a position measurement sensor (position measuring device) 9 that is disposed on each stage 5a, 5b in substitution for a laser interferometer 23, and a reference plate 10 that functions as a measurement object for the position measurement sensor 9. FIG. 6A is a perspective view, and FIG. 6B is a sectional view of the installation position of the position measurement sensor 9. In addition to the reference mark 16 to be measured when performing alignment measurement, each stage 5a, 5b includes installation of an aberrometer 18, an illumination sensor 17, and a water leakage sensor 24. In the present embodiment, a plurality of position measurement sensors 9 is provided on the surface of each stage 5a, 5b by avoiding the installation position of these sensors or the like. The position measurement of each stage 5a, 5b in the XY plane is performed by detecting a reference in the reference plate 10 by use of the position measurement sensor 9. In this manner, since there is no requirement to install a mirror 22 on the side surfaces of each stage 5a, 5b as a result of omission of use of a laser interferometer 23, the limitation in relation to the delivery position of the immersion liquid 13 as in the conventional configuration may be overcome, and delivery according to the present embodiment is enabled. On the other hand, FIG. 7 is a schematic plan view illustrating a configuration in which a mirror 22 is only disposed on the side, of the side surfaces of each stage 5a, 5b, on which delivery of the immersion liquid 13 is not performed. This configuration also enables delivery according to the present embodiment.

As described above, according to the present embodiment, an immersion exposure apparatus which is advantageous in terms of efficient delivery of an immersion liquid on a surface between plural stages of a wafer stage can be provided.

(Second Embodiment)

Figure 8:
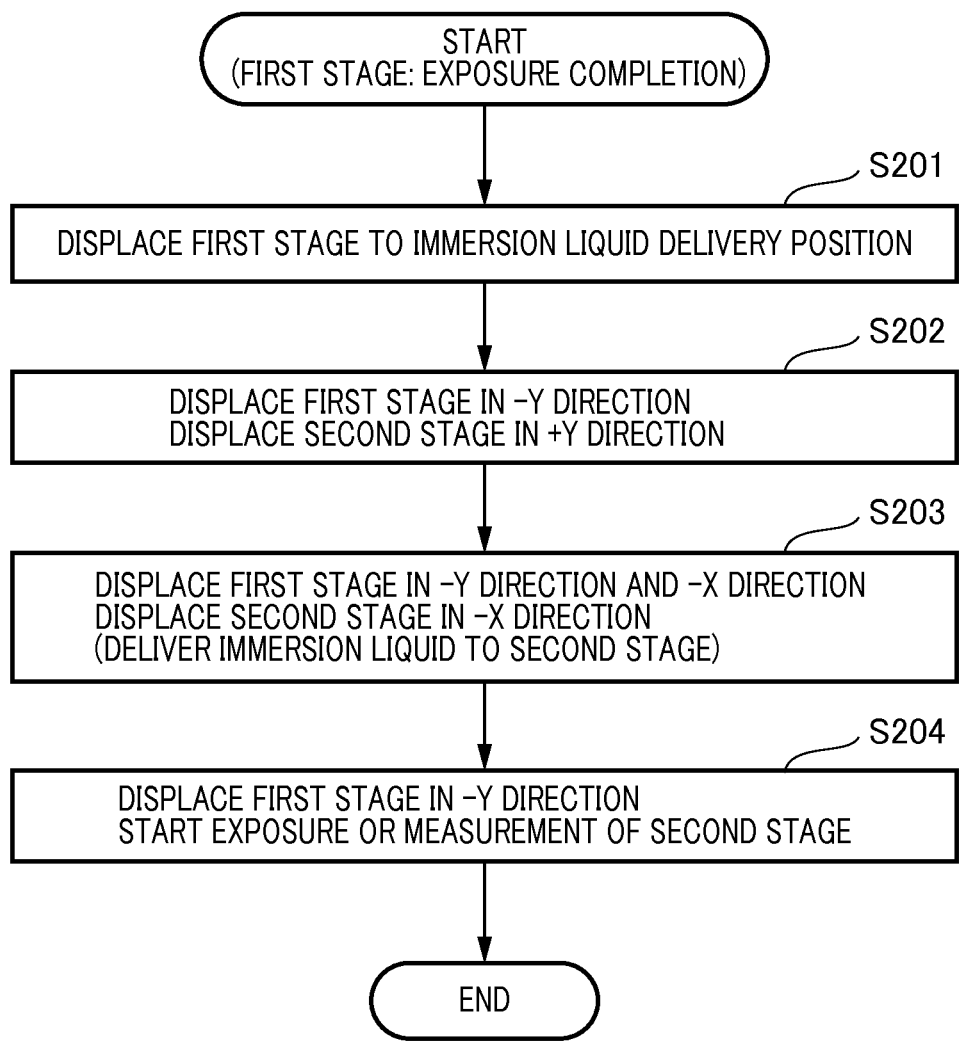
FIG. 8 is a flowchart illustrating the flow of the delivery operation according to a second embodiment.

Next, an exposure apparatus according to a second embodiment of the present invention will be described. In the first embodiment described above, when delivering the immersion liquid 13, each stage 5a, 5b is displaced in parallel in one direction only (in the above example, the X axis direction). In this regard, the exposure apparatus according to the present embodiment has a feature that when delivering the immersion liquid 13, each stage 5a, 5b not only moves in the direction of delivery of the immersion liquid 13, but also moves in another direction (the Y axis direction). FIG. 8 is a flowchart illustrating the basic sequence of the delivery operation according to the present embodiment. FIG. 9A to FIG. 9D and FIG. 10A to FIG. 10C are schematic plan views that illustrate a time sequence of the delivery operation according to the present embodiment. In the same manner as FIG. 4A to FIG. 4D of the first embodiment, a configuration is illustrated in which, after completion of exposure of the first wafer 14a on the first stage 5a, the first pattern forming area that is provided on the second wafer 14b on the second stage 5b is positioned in the exposure position.

Figure 9:
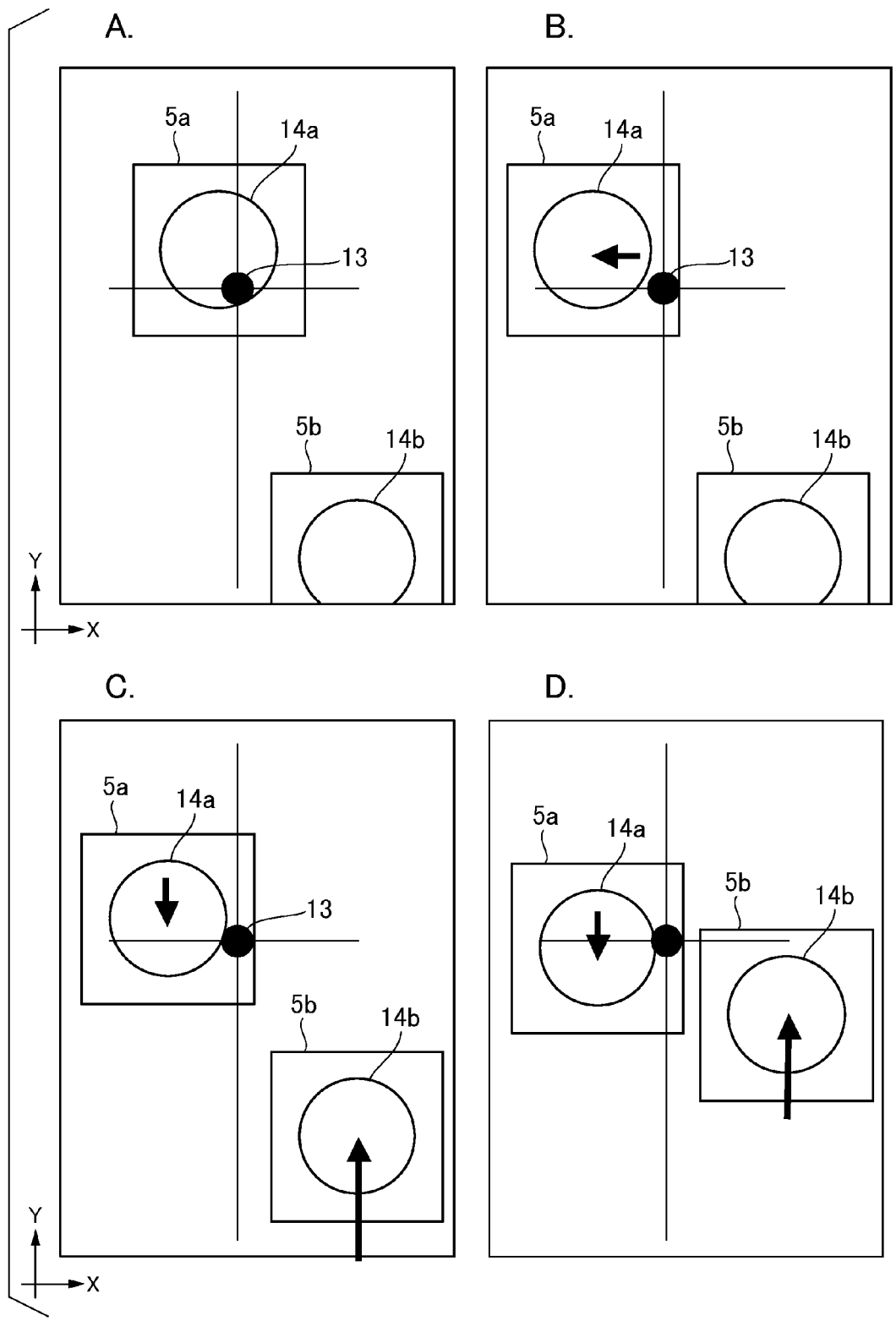
FIG. 9A to FIG. 9D illustrate a time sequence of the delivery operation according to the second embodiment.
Figure 10:
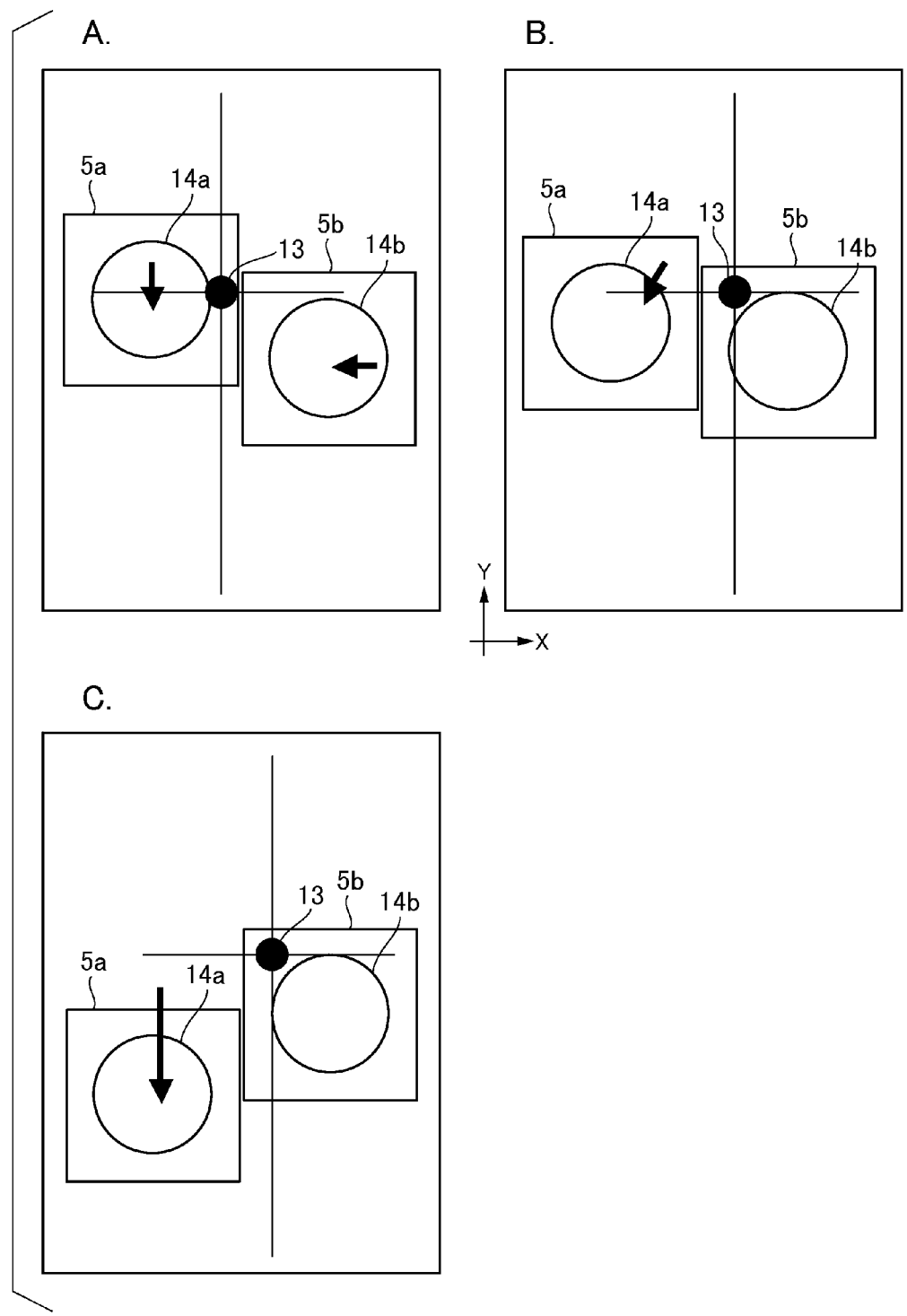
FIG. 10A to FIG. 10C illustrate a time sequence of the delivery operation according to the second embodiment.

Firstly, the controller 20 completes exposure of the first wafer 14a on the first stage 5a, and then displaces the first stage 5a to the delivery position of the immersion liquid 13 (step S201). FIG. 9A illustrates the configuration of each of the stages 5a, 5b when exposure is completed on the first stage 5a. On the other hand, FIG. 9B illustrates a configuration in which the first stage 5a moves on the horizontal line from the configuration illustrated in FIG. 9A to the delivery position. The displacement of the first stage 5a at this time means that the stages 5a, 5b avoid a collision, since the second stage 5b moves towards +side in the Y axis direction (the side on which the first stage 5a is disposed) in the next step. Next, the controller 20 displaces the first stage 5a towards −side in the Y axis direction and displaces the second stage 5b towards the+side in the Y axis direction (step S202). FIG. 9C illustrates the configuration in which each stage 5a, 5b starts displacement. At this time, the controller 20 displaces the second stage 5b in particular to a position in the X axis direction that matches the first processing position. FIG. 9D illustrates a configuration in which the second stage 5b has been displaced to the position in the X axis direction (substantially the delivery position in the X axis direction). Next while the controller 20 displaces the first stage 5a in an inclined direction (the −side in Y axis direction and −side in the X axis direction), the controller 20 displaces the second stage 5b in parallel in a completely horizontal direction (the −side in the X axis direction) and thereby the immersion liquid 13 is displaced to the delivery position of the second stage 5b (step S203). FIG. 10A illustrates the configuration of each stage 5a, 5b immediately before commencement of step S203. FIG. 10B illustrates the configuration after delivery of the immersion liquid 13 to the second stage 5b side. Then the controller 20 retracts the first stage 5a without modification in the −side in Y axis direction (displaces to the next specified position), and then displaces the second stage 5b to be positioned in the first processing position (step S205). FIG. 10C illustrates the displacement of the first stage 5a without modification in toward the −side in the Y axis direction, and the displacement of the second stage 5b to the measurement position.

According to the present embodiment, the delivery operation in particular of the second stage 5b is configured to determine the delivery position for the second stage 5b based on the first processing position (measurement position or exposure start position). In this manner, the displacement time for the second stage 5b can be reduced to less than a conventional configuration. In addition, in the present embodiment, the first stage 5a that is on the delivery side for the immersion liquid 13 continues to be displaced in the Y axis direction during the series of delivery operations. In this manner, the first stage 5a can reduce the time taken to arrive at the next specified position (in this case, for example, a wafer conveying unit 8 (reference is made to FIG. 1)).

Figure 11:
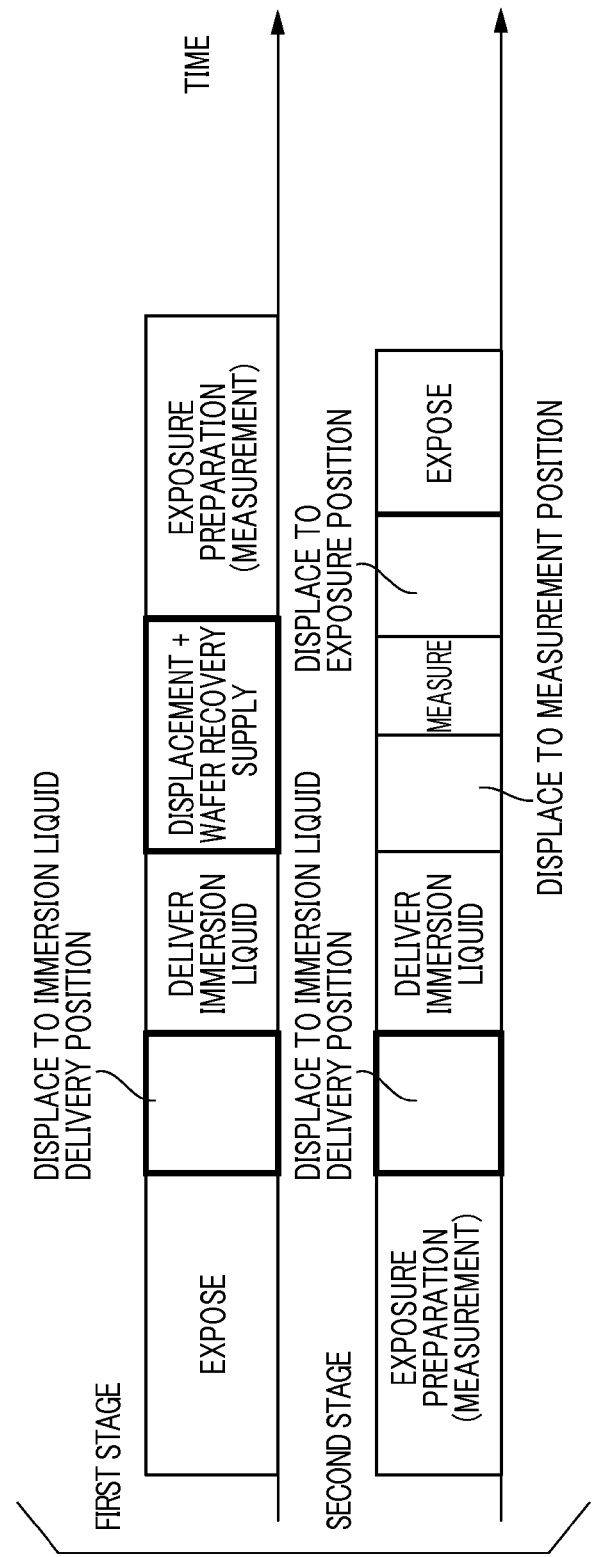
FIG. 11 is a timing chart illustrating a wafer stage according to the second embodiment.

FIG. 11 is a timing chart according to the present embodiment. FIG. 11 corresponds to FIG. 5 that has been used in the description according to the first embodiment. In this context, as compared with FIG. 5A that illustrates the conventional configuration, it can be understood that the delivery operation described above can reduce the time required for the "displacement+wafer recovery/supply", in particular, for the first stage 5a as shown in FIG. 11. Furthermore, the time required for the "displace to delivery position for immersion liquid" can be reduced as a result of the displacement of the first stage 5a in the—side in the Y axis direction and the displacement of the second stage 5b in the +side in Y axis direction during the delivery of the immersion liquid 13 illustrated in FIG. 10A to FIG. 10B,. Therefore, the overall exposure sequence according to this embodiment also results in a reduction in the processing time as compared with a conventional exposure apparatus.

(Device Manufacturing Method)

Next, a description will be given of a method for manufacturing a device (semiconductor device, liquid crystal display device, or the like) according to one embodiment of the present invention. The semiconductor device is manufactured by a front-end process in which an integrated circuit is formed on a wafer and a back-end process in which an integrated circuit chip is completed as a product from the integrated circuit on the wafer formed in the front-end process. The front-end process includes a step of exposing a wafer coated with a photosensitizer using the above-described exposure apparatus and a step of developing the exposed wafer. The back-end process includes an assembly step (dicing and bonding) and a packaging step (sealing). The liquid crystal display device is manufactured by a process in which a transparent electrode is formed. The process of forming a transparent electrode includes a step of applying a photosensitizer to a glass substrate on which a transparent conductive film is deposited, a step of exposing the glass substrate coated with the photosensitizer using the above-described exposure apparatus, and a step of developing the exposed glass substrate. According to the device manufacturing method of the present embodiment, a device having a higher quality than that of the conventional device may be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-185914 filed Sep. 9, 2013, which is hereby incorporated by reference herein in its entirety.

What is claimed is:

1. An exposure apparatus including a measurement area for measuring a substrate, and an exposure area, which differs from the measurement area, for exposing the substrate via a projection optical system, and executing an exposure operation while supplying an immersion liquid between the projection optical system and the substrate disposed in the exposure area, the exposure apparatus comprising:

plural stages each configured to hold the substrate and to be movable, and a controller configured to control the driving of the plural stages,
wherein the controller is configured to determine a receiving position for delivering the immersion liquid supplied onto one stage of the plural stages to another stage based on a first processing position for the substrate held by the other stage, which is acquired based on a formulaic recipe regarding a layout of a patterning area on the substrate.

2. The exposure apparatus according to claim 1, wherein the first processing position is for starting the exposure operation or for a measurement in the exposure area.

3. The exposure apparatus according to claim 1, wherein the controller is configured to determine a delivery position of the immersion liquid for the one stage based on an exposure completion position for the one stage.

4. The exposure apparatus according to claim 1, wherein the plural stages comprise a position measurement device configured to measure a stage position by illuminating light to a reference plate installed at a position on the respective surfaces of the plural stages facing the position measurement device.

5. The exposure apparatus according to claim 1, further comprising:
an interferometer configured to measure positions of the plural stages; and
a mirror disposed on the sides of the plural stages and configured to reflect light illuminated from the interferometer,
wherein the mirror is not installed on a delivering side of the immersion liquid on the one stage and a receiving side of the immersion liquid on the other stage.

6. A device manufacturing method comprising:
exposing a substrate using an exposure apparatus; and
developing the exposed substrate, wherein:
the exposure apparatus includes a measurement area for measuring a substrate, and an exposure area, which differs from the measurement area, for exposing the substrate via a projection optical system, and executes an exposure operation while supplying an immersion liquid between the projection optical system and the substrate disposed in the exposure area, the exposure apparatus comprising:
plural stages each configured to hold the substrate and to be movable, and
a controller configured to control the driving of the plural stages,
wherein the controller is configured to determine a receiving position for delivering the immersion liquid supplied onto one stage of the plural stages to another stage based on a first processing position for the substrate held by the other stage, which is acquired based on a formulaic recipe regarding a layout of a patterning area on the substrate.

7. The exposure apparatus according to claim 1, wherein the controller is configured to control displacement of the one stage to deliver the immersion liquid supplied onto one stage to the other stage while displacing the one stage in a direction directed to a conveying unit for conveying the substrate held by the one stage.

8. The exposure apparatus according to claim 1, wherein the receiving position is a position where the immersion liquid on the other stage is movable to the first processing position by linearly displacement of the other stage.

9. An exposure apparatus including a measurement area for measuring a substrate, and an exposure area, which differs from the measurement area, for exposing the substrate via a projection optical system, and executing an exposure operation while supplying an immersion liquid between the projection optical system and the substrate disposed in the exposure area, the exposure apparatus comprising:
plural stages each configured to hold the substrate and to be movable, and
a controller configured to control the driving of the plural stages and to change a receiving position on one stage of the plural stages for receiving the immersion liquid supplied from another stage of the plural stages such that the one stage receives the immersion liquid at a first receiving position in a case where a first processing on the one stage or the substrate held by the one stage is to be performed at a first processing position, and the one stage receives the immersion liquid at a second receiving position different from the first receiving position in a case where a second processing on the one stage or the substrate held by the one stage is to be performed at a second processing position different from the first processing position,
wherein the first processing position and the second processing position are determined based on a layout of a patterning area on the substrate held by the one stage.

10. An exposure apparatus including a measurement area for measuring a substrate, and an exposure area, which differs from the measurement area, for exposing the substrate via a projection optical system, and executing an exposure operation while supplying an immersion liquid between the projection optical system and the substrate disposed in the exposure area, the exposure apparatus comprising:
plural stages each configured to hold the substrate and to be movable, and
a controller configured to control the driving of the plural stages,
wherein the controller is configured to control the driving of the plural stages such that the immersion liquid is supplied from one stage to another stage while the controller displaces the one stage toward a composite direction, the composite direction being the sum of a first vector oriented in a first direction and a second vector oriented in a second direction orthogonal to the first direction, the controller further displacing the another stage toward the first direction.

11. The exposure apparatus according to claim 10, wherein a conveying unit configured to convey the substrate held by the one stage is provided in the second direction to the one stage.

12. The exposure apparatus according to claim 9, wherein the controller is further configured to change a delivery position on the another stage for supplying the immersion liquid to the one stage according to an exposure completion position on the another stage such that the immersion liquid is supplied from a first delivery position in a case where an exposure process on the another stage ends at a first exposure completion position, and the immersion liquid is supplied from a second delivery position different from the first delivery position in a case where the exposure process on the another stage ends at a second exposure completion position different from the first exposure completion position.

13. The exposure apparatus according to claim 9, wherein each of the first processing and the second processing is one of measuring performed on a measuring position on the one stage and exposure operation performed on a exposure position on the substrate held by the one stage.

14. An exposure apparatus including a measurement area for measuring a substrate, and an exposure area, which differs from the measurement area, for exposing the substrate via a projection optical system, and executing an exposure operation while supplying an immersion liquid between the projection optical system and the substrate disposed in the exposure area, the exposure apparatus comprising:

plural stages configured to hold the substrate and to be movable, and
   a controller configured to control the driving of the plural stages and to change a delivery position on one stage for supplying the immersion liquid to another stage according to an exposure completion position on the one stage such that the immersion liquid is supplied from a first delivery position in a case where an exposure process on the one stage ends at a first exposure completion position, and the immersion liquid is supplied from a second delivery position different from the first delivery position in a case where the exposure process on the one stage ends at a second exposure completion position different from the first exposure completion position,
   wherein the first exposure completion position and the second exposure completion position are determined based on a layout of a patterning area on the substrate on the one stage.

* * * * *